United States Patent
Song et al.

(10) Patent No.: US 9,450,066 B2
(45) Date of Patent: Sep. 20, 2016

(54) VERTICALLY MOVABLE GATE FIELD EFFECT TRANSISTOR (VMGFET) ON A SILICON-ON-INSULATOR (SOI) WAFER AND METHOD OF FORMING A VMGFET

(71) Applicant: Texas State University, San Marcos, TX (US)

(72) Inventors: In-Hyouk Song, San Marcos, TX (US); Byoung Hee You, San Marcos, TX (US); Heung Seok Kang, Daejeon (KR); Kang-Hee Lee, Daejeon (KR)

(73) Assignee: Texas State University, San Marcos, TX (US)

( * ) Notice: Subject to any disclaimer, the term of this patent is extended or adjusted under 35 U.S.C. 154(b) by 0 days.

(21) Appl. No.: 14/435,303

(22) PCT Filed: Oct. 10, 2013

(86) PCT No.: PCT/US2013/064239
§ 371 (c)(1),
(2) Date: Apr. 13, 2015

(87) PCT Pub. No.: WO2014/059080
PCT Pub. Date: Apr. 17, 2014

(65) Prior Publication Data
US 2015/0295062 A1 Oct. 15, 2015

Related U.S. Application Data

(60) Provisional application No. 61/795,210, filed on Oct. 12, 2012.

(51) Int. Cl.
*H01L 29/51* (2006.01)
*H01L 29/423* (2006.01)
(Continued)

(52) U.S. Cl.
CPC ....... *H01L 29/515* (2013.01); *H01L 29/42372* (2013.01); *H01L 29/51* (2013.01); *H01L 29/66477* (2013.01); *H01L 29/78* (2013.01); *H01L 29/7841* (2013.01)

(58) Field of Classification Search
None
See application file for complete search history.

(56) References Cited

U.S. PATENT DOCUMENTS

| 4,259,366 A | 3/1981 | Balasubramanian et al. |
| 4,282,540 A | 8/1981 | Ning et al. |

(Continued)

FOREIGN PATENT DOCUMENTS

FR    EP 2015223 A2 *  1/2009 ........... G06K 9/0002

OTHER PUBLICATIONS

International Preliminary Report on Patentability from PCT/US2013/064239, issued Apr. 23, 2015, Texas State University—San Marcos, pp. 1-6.

(Continued)

*Primary Examiner* — Evren Seven
(74) *Attorney, Agent, or Firm* — Meyertons, Hood, Kivlin, Kowert & Goetzel, P.C.; Eric B. Meyertons

(57) ABSTRACT

Methods for forming a vertically movable gate field effect transistor (VMGFET) on a silicon-on-insulator (SOI) wafer are described. The methods include providing a process of making VMGFET devices without critical alignment of masks between sequential etch and diffusion steps. The oxide layer of the SOI wafer is used for a self-limiting etch stop layer and for a sacrificial layer to form an insulating layer between a gate electrode and a substrate. The proper location of the gate electrode with respect to the source and drain junctions is insured by using a silicon gate structure as a mask layer for the diffusion process for defining the source and drain junctions.

5 Claims, 3 Drawing Sheets

(51) Int. Cl.
*H01L 29/78* (2006.01)
*H01L 29/66* (2006.01)
*H01L 21/00* (2006.01)

(56) References Cited

U.S. PATENT DOCUMENTS

| | | | |
|---|---|---|---|
| 4,701,643 A | 10/1987 | Laude et al. | |
| 4,785,263 A | 11/1988 | Kaltenecker et al. | |
| 4,906,586 A * | 3/1990 | Blackburn | H01L 29/84 257/254 |
| 5,576,251 A * | 11/1996 | Garabedian | B81C 1/00238 257/E29.324 |
| 5,883,411 A | 3/1999 | Ueda et al. | |
| 6,038,928 A * | 3/2000 | Maluf | G01L 9/0042 257/419 |
| 6,046,659 A * | 4/2000 | Loo | B81B 3/0072 200/181 |
| 6,204,544 B1 | 3/2001 | Wang et al. | |
| 6,440,767 B1 * | 8/2002 | Loo | H01H 59/0009 200/181 |
| 6,448,622 B1 * | 9/2002 | Franke | B81C 1/00246 257/414 |
| 6,639,289 B1 * | 10/2003 | Hays | B81C 1/00595 257/414 |
| 7,028,551 B2 * | 4/2006 | Park | G01L 9/0073 257/419 |
| 7,083,997 B2 * | 8/2006 | Brosnihhan | B81C 1/00142 438/455 |
| 7,493,822 B2 * | 2/2009 | Stewart | G01L 9/0042 257/419 |
| 7,704,774 B2 * | 4/2010 | Mayer | B81C 1/0023 257/E21.001 |
| 2003/0173611 A1 * | 9/2003 | Bertz | G01L 9/0098 257/302 |
| 2005/0227428 A1 | 10/2005 | Mihai et al. | |
| 2006/0148142 A1 | 7/2006 | Kim | |
| 2006/0245034 A1 | 11/2006 | Chen et al. | |
| 2008/0134759 A1 * | 6/2008 | Mohammed-Brahim | G01N 27/4143 73/31.06 |
| 2009/0321793 A1 | 12/2009 | Ollier et al. | |
| 2010/0213546 A1 * | 8/2010 | Liu | H01L 21/845 257/347 |
| 2012/0107994 A1 * | 5/2012 | Taya | B23K 26/0057 438/53 |
| 2013/0328109 A1 * | 12/2013 | Lal | B81C 1/00246 257/254 |

OTHER PUBLICATIONS

International Search Report / Written Opinion from PCT/US2013/064239, issued Jan. 17, 2014, Texas State University—San Marcos.

* cited by examiner

VERTICALLY MOVABLE GATE FIELD EFFECT TRANSISTOR (VMGFET) ON A SILICON-ON-INSULATOR (SOI) WAFER AND METHOD OF FORMING A VMGFET

BACKGROUND OF THE INVENTION

1. Field of the Invention

The invention generally relates to semiconductor devices. More particularly, the invention relates to suspended gate transistors.

2. Description of the Relevant Art

Suspended gate field effect transistors (FETs) are semiconductor devices that have a suspended, movable gate. If the gate is movable in the vertical direction, the device is referred to as vertically movable gate field effect transistors (VMGFETs). A VMGFET includes a suspended gate electrode, insulator and semiconductor composite structure. In current VMGFETs, metal or poly-silicon has been used as a gate material. The use of metal or polysilicon requires additional deposition and etching processes for the formation of the VMGFET. It is desirable to have more efficient and cost effective methods of making VMGFETs.

SUMMARY OF THE INVENTION

In one embodiment, a semiconductor includes: a semiconductor substrate; source and drain regions disposed in the semiconductor substrate; a gate electrode, positioned between the source and drain regions; and an insulator disposed between the gate electrode and the semiconductor substrate, wherein the insulator comprises an air layer and a gate oxide layer, wherein the gate electrode is vertically movable within the air layer of the insulator. The conductivity type of the gate electrode is the opposite to that of the semiconductor substrate. The conductivity type of the gate electrode is the same conductivity type as the source and drain regions. In an embodiment, the gate electrode is composed of a single crystalline semiconductor material that has been highly doped to be electrically conductive.

A method of making a semiconductor device includes: forming a sacrificial layer on a semiconductor substrate; forming a gate electrode on the sacrificial layer; removing the sacrificial layer over the source and drain regions; simultaneously implanting ions into the source region, the drain region and the gate electrode; and removing the sacrificial layer, wherein removal of the sacrificial layer creates an air layer between the gate electrode and the semiconductor substrate, wherein the gate electrode is vertically movable within the air layer. An oxide layer may be formed on the semiconductor substrate after the sacrificial layer is removed.

In an embodiment, forming the gate electrode comprises: forming a device layer on the sacrificial layer, wherein the device layer comprises a single crystalline semiconductor material that has been doped to be electrically conductive; and patterning the device layer to form the gate electrode.

In an embodiment, removing the sacrificial layer over the source and drain regions comprises: forming a photoresist layer on the sacrificial layer; etching the photoresist layer such that the photoresist is removed from the source and drain regions and the gate electrode; and etching the portion of the exposed sacrificial layer.

The ion source used to implant the source, drain and gate electrode has an opposite conductivity than the conductivity of the semiconductor substrate. During implantation, the gate electrode masks the channel from implantation when the source and drain regions are implanted with ions.

The VMGFET described herein may be used as part of a microelectromechanical system. VMGFETs are particularly useful for microelectromechanical resonators.

BRIEF DESCRIPTION OF THE DRAWINGS

Advantages of the present invention will become apparent to those skilled in the art with the benefit of the following detailed description of embodiments and upon reference to the accompanying drawings in which.

Figure 1:
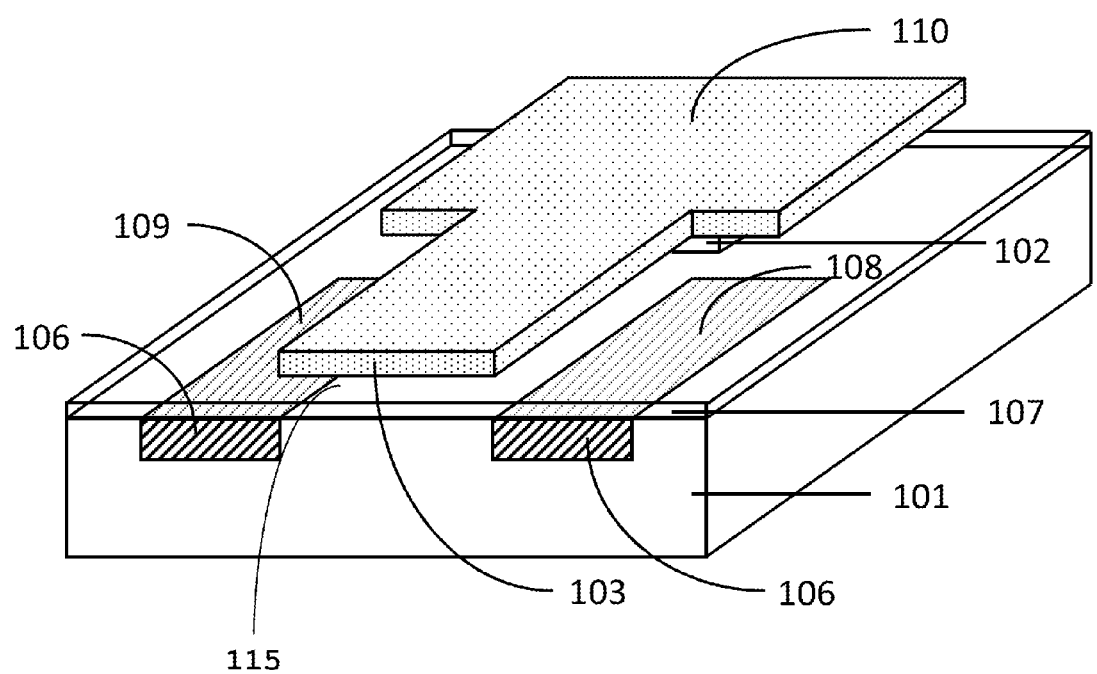
FIG. 1 is a perspective view partly in section showing a VMGFET structure.

While the invention may be susceptible to various modifications and alternative forms, specific embodiments thereof are shown by way of example in the drawings and will herein be described in detail. The drawings may not be to scale. It should be understood, however, that the drawings and detailed description thereto are not intended to limit the invention to the particular form disclosed, but to the contrary, the intention is to cover all modifications, equivalents, and alternatives falling within the spirit and scope of the present invention as defined by the appended claims.

DETAILED DESCRIPTION OF THE PREFERRED EMBODIMENTS

It is to be understood the present invention is not limited to particular devices or methods, which may, of course, vary. It is also to be understood that the terminology used herein is for the purpose of describing particular embodiments only, and is not intended to be limiting. As used in this specification and the appended claims, the singular forms "a", "an", and "the" include singular and plural referents unless the content clearly dictates otherwise. Furthermore, the word "may" is used throughout this application in a permissive sense (i.e., having the potential to, being able to), not in a mandatory sense (i.e., must). The term "include," and derivations thereof, mean "including, but not limited to." The term "coupled" means directly or indirectly connected.

In an embodiment, the gate electrode of a VMGFET is formed with a highly doped silicon gate using a device layer of a SOI wafer, which is widely used in the wafer manufacturing process. The described method reduces the fabrication process and time, allowing manufacturers to develop efficient and cost-effective production methods. The process relies on the use of a highly doped silicon device layer of a SOI wafer as a gate material and a mildly doped handle layer of a SOI wafer as a substrate. The conductivity type of the gate layer is the opposite to that of the substrate. The oxide layer between the device layer and handle layer works as a sacrificial layer to release gate structure from the substrate.

The gate structure is patterned before forming the source and drain regions. The gate structure, therefore, may be used as a masking structure, hence, the method reduces a processing step and insures the alignment of channel and gate structure. The gate electrode provides a diffusion mask layer for forming source and drain regions without a critical alignment since the gate electrode overlies the channel area of the FET. While diffusing or ion implanting, the gate structure does not need to be protected or covered with other material, resulting in a reduced fabrication processes (deposition and etching). The gate electrode and the source/drain regions are opened for the diffusion process so that they are doped at the same time. The doping process makes the gate electrode more conductive. The oxide layer under the patterned gate structure absorbs and blocks diffusion of the impurities, which is etched completely before the oxidation process for the gate oxide layer.

Referring to FIG. 1, a substrate 101 acts as a silicon handle layer of a silicon-on-insulator (SOI) wafer. The gate electrode 103 is formed from a highly doped silicon device layer of a SOI wafer, which is the opposite conductivity type semiconductor material to the substrate 101. Two regions 106s are diffused for the source and the drain of field effect transistor having the opposite conductivity type formed in a semiconductor substrate 101. Overlying the silicon substrate 101, containing diffused regions 106s, is a layer of silicon dioxide 107. The source electrode at 108, the drain electrode at 109 and the gate electrode contact at 110 are also shown. The VMGFET includes a suspended gate electrode 103, composed of a single crystalline semiconductor material that has been doped to be electrically conductive. An insulator is disposed between gate electrode 103 and a substrate 101 which includes air layer 115 and oxide layer 107. Gate electrode 103 is vertically movable within air layer 115 of the insulator.

Figure 2:
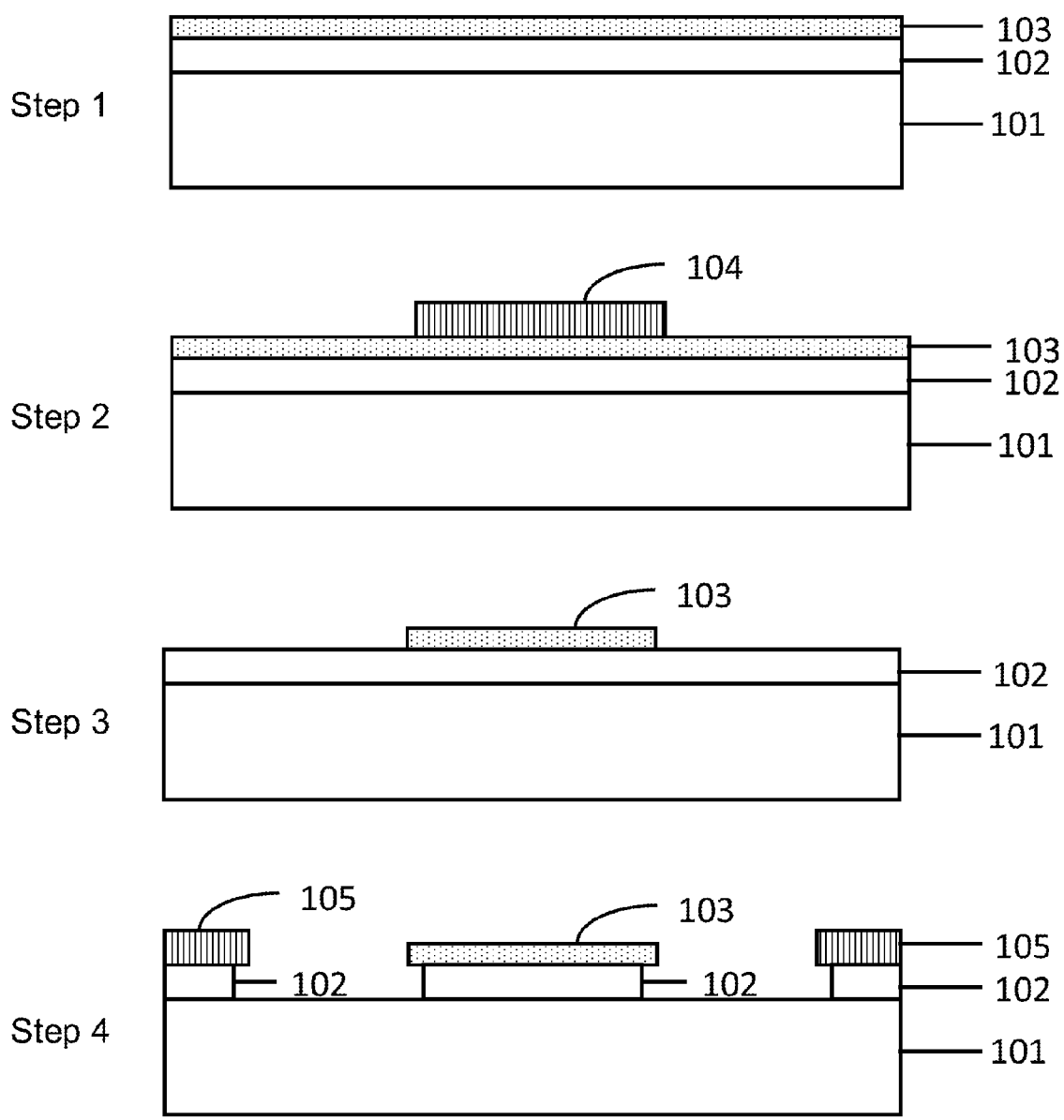
FIG. 2 is a schematic sequential representation of a process of forming a VMGFET structure.
Figure 2:
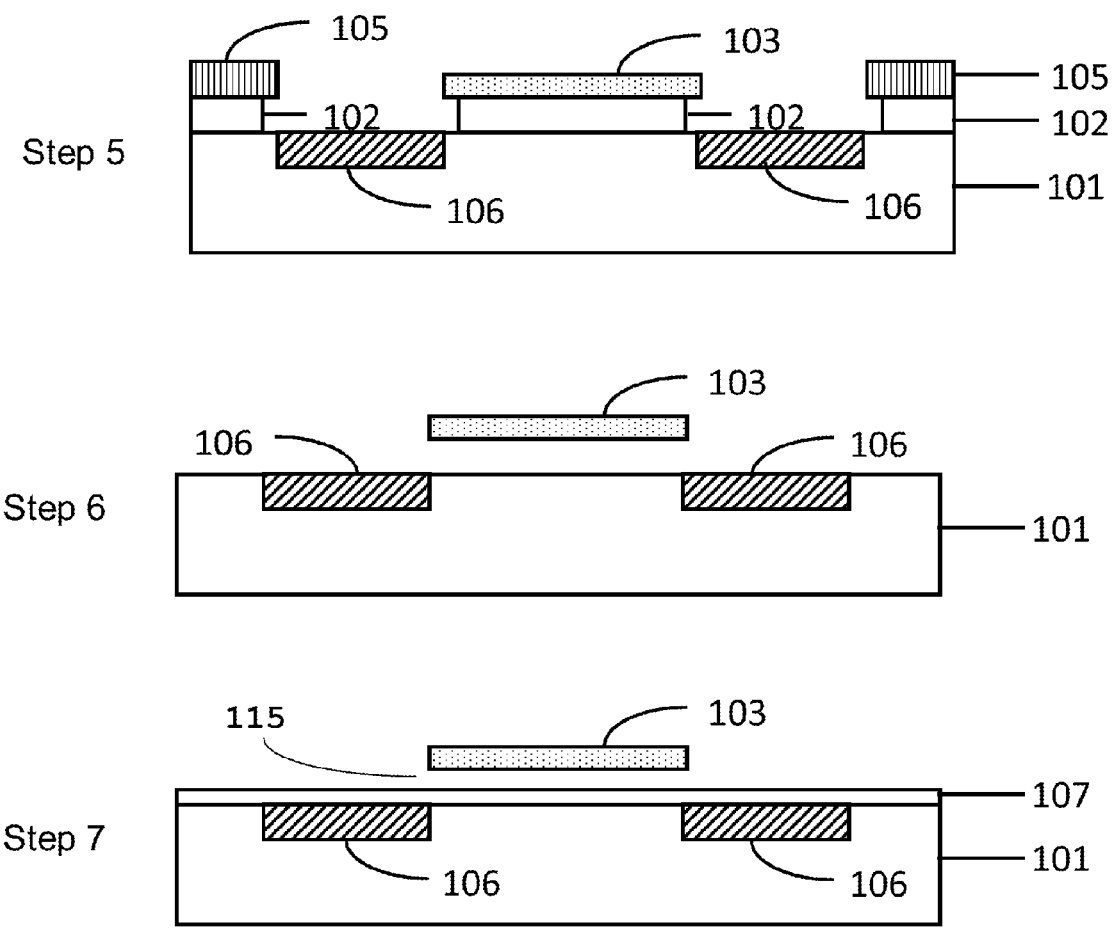

A specific sequence of steps for forming VMGFET structure in FIG. 1 is shown in FIG. 2. A silicon-on-insulator (SOI) wafer is used to form the VMGFET. Initially (Step 1) the silicon-on-insulator wafer includes a semiconductor substrate 101, which serves as the handle layer. A sacrificial layer 102 (e.g., a silicon oxide layer) is formed on the semiconductor substrate. Sacrificial layer 102 has a thickness of the order of less than 1 µm. Finally, a highly doped silicon layer (103) is formed on the sacrificial layer 102. The conductivity type of handle layer 101 of the SOI wafer is the opposite conductivity type of the material of the device layer 103. For example, for an n-channel case, the gate material incorporates an n-type doped device layer while a p-type doped handle layer is used, and for a p-channel case, a p-type doped device layer for a gate material and an n-type doped handle layer are applied. The handle layer 101 is used for a substrate of field effect transistor embedding source and drain regions. The sacrificial layer 102 of the SOI wafer is used to release a gate structure from the substrate and to limit the distance between the gate structure and the substrate to a maximum of 1 µm. The thickness of the device layer determines the flexibility of a resonant gate structure. So, the thickness of the device layer can be chosen depending on the application and its specifications.

In Step 2, a photoresist 104 is applied to the device layer 103 (e.g., by spin-coating). Photoresist layer 104 is patterned using a UV-lithography process. The patterned photoresist 104 acts as a mask layer for the next silicon etching step.

In Step 3, the exposed device layer 103 is etched to create the gate. Device layer 103 may be etched using a reactive ion etching process. The use of a SOI wafer proves beneficial. During the etching process sacrificial layer 102 limits etching to the silicon device layer 103, protecting the semiconductor substrate 101 from etching. Thus, sacrificial layer 102 also acts as a self-limiting etch stop layer. After the etching process is completed, the photoresist 104 is removed.

In Step 4, a photoresist layer 105 is applied and patterned using a UV-lithography process. Photoresist layer 105 is patterned to define the source/drain regions. The exposed part of sacrificial layer 102 is etched to expose the source/drain regions.

In Step 5, the exposed areas, which includes the gate electrode, the source region and the drain region are diffused using an ion implantation technique or diffusion technique. In this process, the ion/diffusion source necessary to form the opposite conductivity type of substrate 101 is selected and implanted to the gate electrode. The gate electrode provides a diffusion mask layer when forming the source and drain regions, without a critical alignment step, since the gate electrode overlies the channel area of the FET. The sacrificial layer 102 also prevents impurity diffusion into the FET channel by absorbing the impurities that diffused through the gate electrode. The gate electrode does not need to be protected, since adding additional impurities into the gate electrode during source/drain formation, makes the gate electrode more conductive.

In Step 6, the sacrificial layer 102 underneath the gate electrode is completely etched away after removing photoresist 105. The removal of sacrificial layer 102 forms an air gap underneath gate electrode 103, allowing the gate electrode to be suspended and free to move in a vertical direction.

In Step 7, gate oxide layer 107 is grown on the entire silicon substrate 101 to prevent surface current leakage during use and to inhibit natural oxidation.

In this method, device layer 103 is used to form a movable gate, and oxide layer 102 as a sacrificial layer to release the gate electrode from the semiconductor substrate. The semiconductor substrate 101 is used as the handle layer and includes the source and drain.

A major advantage of using the device layer of a SOI wafer as a gate electrode is that it minimizes the internal stress of the gate structure. Other materials used to form a gate electrode in a VMGFET, such as metal or poly-silicon, induce the deformation of the gate structure due to internal stresses, such as tensile stress or compressive stress, resulting from the deposition process. This stress limits the shape of the gate structure. The single crystalline device layer of the SOI wafer, however, ideally lacks any internal stress. Therefore, using a single crystalline gate device layer yields greater design flexibility. In addition, SOI wafers are known to offer lateral and vertical isolation of integrated components and also known to provide devices with superior electrical properties.

Currently, the SOI wafer is also applied in forming Microelectromechanical Systems (MEMS) to fabricate resonant structures using an oxide layer as a sacrificial layer. Hence, the use of a SOI wafer to form VMGFET is beneficial to monolithic integration with electronics: both the VMGFET and the electronic circuitry can be fabricated on the same chip.

Further modifications and alternative embodiments of various aspects of the invention will be apparent to those skilled in the art in view of this description. Accordingly, this description is to be construed as illustrative only and is for the purpose of teaching those skilled in the art the general manner of carrying out the invention. It is to be understood that the forms of the invention shown and described herein are to be taken as examples of embodiments. Elements and materials may be substituted for those illustrated and described herein, parts and processes may be reversed, and certain features of the invention may be utilized independently, all as would be apparent to one skilled in the art after having the benefit of this description of the invention. Changes may be made in the elements described herein without departing from the spirit and scope of the invention as described in the following claims.

What is claimed is:

1. A method of making a semiconductor device, comprising: forming a sacrificial layer on a semiconductor substrate;
    forming a gate electrode on the sacrificial layer, wherein the gate electrode is composed of a single crystalline semiconductor material;
    removing a portion of the sacrificial layer over regions adjacent to the gate electrode that will become a source region and a drain region:
    implanting/diffusing ions into the source region and the drain region adjacent to the gate electrode while implanting/diffusing ions into the gate electrode, wherein the ions implanted into the gate electrode are the opposite conductivity type to the conductivity type of the semiconductor substrate; and
    then removing the remainder of the sacrificial layer, wherein removal of the sacrificial layer creates an air layer between the gate electrode and the semiconductor substrate, wherein the gate electrode is vertically movable within the air layer.

2. The method of claim 1, wherein forming the gate electrode comprises:
    forming a device layer on the sacrificial layer, wherein the device layer comprises a single crystalline semiconductor material that has been doped to be electrically conductive; and
    patterning the device layer to form the gate electrode.

3. The method of claim 1, wherein removing the sacrificial layer over the source and drain regions comprises:
    forming a photoresist layer on the entire wafer;
    etching the photoresist layer such that the photoresist is removed from the source and drain regions and the gate electrode; and
    etching the portion of the exposed sacrificial layer.

4. The method of claim 1, wherein the gate electrode masks the channel from implantation/diffusion when the source and drain regions are implanted/diffused with ions.

5. The method of claim 1, further comprising forming an oxide layer on the semiconductor substrate after the sacrificial layer is removed.

* * * * *